United States Patent
Hsu

(10) Patent No.: US 7,514,786 B2
(45) Date of Patent: Apr. 7, 2009

(54) SEMICONDUCTOR CHIP ELECTRICAL CONNECTION STRUCTURE

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 387 days.

(21) Appl. No.: 11/118,384

(22) Filed: May 2, 2005

(65) Prior Publication Data

US 2006/0163722 A1     Jul. 27, 2006

(30) Foreign Application Priority Data

Jan. 21, 2005    (TW) .............................. 94101762 A

(51) Int. Cl.
*H01L 23/48*     (2006.01)
*H01L 21/44*     (2006.01)

(52) U.S. Cl. ............... 257/737; 257/758; 257/E23.021; 438/612; 438/613

(58) Field of Classification Search ................ 257/737, 257/758, E23.021, E23.145; 438/612, 613, 438/614
See application file for complete search history.

(56) References Cited

U.S. PATENT DOCUMENTS

| | | | | |
|---|---|---|---|---|
| 6,351,031 B1* | 2/2002 | Iijima et al. | .................. | 257/698 |
| 6,906,408 B2* | 6/2005 | Cloud et al. | ................. | 257/686 |
| 7,205,674 B2* | 4/2007 | Huang et al. | ................. | 257/787 |
| 2003/0164548 A1* | 9/2003 | Lee | .............................. | 257/738 |

\* cited by examiner

*Primary Examiner*—Hsien-ming Lee
(74) *Attorney, Agent, or Firm*—Clark & Brody

(57) ABSTRACT

A semiconductor chip electrical connection structure includes electrode pads formed on a surface of a semiconductor chip, wherein the semiconductor chip is mounted via another surface thereof on a carrier; a plurality of conductive bumps formed on the electrode pads respectively, and exposed from a dielectric layer applied on the semiconductor chip and the carrier; and a plurality of electrical connection pads formed on the dielectric layer and electrically connected to the conductive bumps exposed from the dielectric layer so as to provide outward electrical extension for the semiconductor chip via the electrical connection pads.

7 Claims, 4 Drawing Sheets

SEMICONDUCTOR CHIP ELECTRICAL CONNECTION STRUCTURE

FIELD OF THE INVENTION

The present invention relates to semiconductor chip electrical connection structures, and more particularly, to a conductive structure for providing electrical extension from electrode pads of a semiconductor chip.

BACKGROUND OF THE INVENTION

Along with evolution of the semiconductor packaging technology, various types of packages for semiconductor devices have been developed. For instance, Ball Grid Array (BGA) employs an advanced semiconductor packaging technique, which is characterized by disposing a semiconductor chip on a front side of a substrate, and mounting a plurality of array-arranged solder balls on a back side of the substrate via a self-alignment technique. This arrangement allows more input/output (I/O) connections to be accommodated on the same unit of area of a semiconductor chip carrier to satisfy the requirement for highly integrated chips, and the entire package unit can be bonded and electrically connected to an external printed circuit board via the solder balls.

Compared with the conventional wire-bonding technology, a flip-chip packaging technique introduced by IBM in early 1960s uses solder bumps, instead of gold wires, for electrical connection between a semiconductor chip and a substrate. The flip-chip packaging technique is advantageous in increasing packaging density and reducing package size. Moreover, the flip-chip packaging technique eliminates the use of relatively long metal wires, thereby improving electrical performances to satisfy the requirement of high-density and high-speed semiconductor devices.

In the current flip-chip packaging technique, a plurality of electrode pads are provided on a surface of a semiconductor IC (integrated circuit) chip, and corresponding contact pads are formed on a circuit board for carrying the semiconductor chip. Solder bumps or other conductive adhesive materials can be adequately disposed between the semiconductor chip and the circuit board so as to allow the semiconductor chip to be mounted on the circuit board in a face-down manner, such that the solder bumps or conductive adhesive materials provide electrical input/output (I/O) and mechanical connections between the semiconductor chip and the circuit board.

FIG. 1 shows a conventional flip-chip package. As shown in FIG. 1, a plurality of metallic bumps 11 are formed on electrode pads 12 of a semiconductor chip 13 respectively, and a plurality of pre-solder bumps 14 made of solder are formed on contact pads 15 of a circuit board 16 respectively. Under a reflow temperature condition sufficient for the pre-solder bumps 14 to melt, the pre-solder bumps 14 are reflowed to the corresponding metallic bumps 11 to form solder joints 17. Further, an organic underfill material 18 can be filled into a gap between the semiconductor chip 13 and the circuit board 16 and encapsulate the solder joints 17, so as to suppress a thermal expansion difference between the semiconductor chip 13 and the circuit board 16 and reduce stress applied to the solder joints 17.

Currently, pre-solder bumps are fabricated primarily by a stencil printing technique to deposit a solder material on contact pads of a circuit board. In fact, packages with miniaturized IC area and high-density multiple leads, such as a BGA package, chip size package (CSP), multi chip module (MCM) and so on, have become mainstream products in the package market due to dramatic growth of various portable electronic devices in communication, network and computer fields. Such packages usually cooperate with highly efficient semiconductor chips such as a microprocessor, chip set, graphic chip and so on to achieve higher speed operation. However, these package structures would reduce circuit trace width and pad size. When a pitch between adjacent pads is continuously decreased, since the pads are partly covered by an insulating protective layer located between the pads, the size of an exposed area of the pads becomes even smaller. This not only causes a positional alignment problem during subsequently forming pre-solder bumps, but also requires decrease of the size of stencil openings in the stencil printing technique, thereby leading to difficulty in depositing the solder material on the contact pads of the circuit board through such small stencil openings. As a result, the stencil printing technique would have low yield and becomes infeasible. Moreover, the stencil cost would be increased due to reduction in the pad size and pad pitch, making the fabrication cost raised. Furthermore, with the pad pitch being decreased, a contact area between the insulating protective layer and the circuit board is reduced, and thus adhesion therebetween becomes weakened. This further causes difficulty in fabricating fine-pitch pre-solder bumps and achieving good electrical connection.

Additionally, during fabrication of flip-chip semiconductor devices, similarly after integrated circuits are completely fabricated for a wafer, a under bump metallurgy (UBM) structure for carrying a metallic bump is formed on each of electrode pads of chips in the wafer. A singulation process is performed to cut the wafer into a plurality of semiconductor chips, and then the semiconductor chips can be mounted on and electrically connected to a circuit board in a flip-chip manner. During fabrication of the UBM structure and metallic bump, firstly, a passivation layer is formed on the wafer, with the electrode pads being exposed from the passivation layer. Then, the UBM structure comprising multiple metallic layers is formed on each of the electrode pads by sputtering and electroplating techniques. Afterwards, a photoresist layer is disposed on the passivation layer, and is preformed with a plurality of openings for exposing the UBM structures. A solder coating process is carried out to apply a solder material such as Sn/Pb alloy on the UBM structures via the openings of the photoresist layer by a screen-printing technique. Subsequently, a reflow process is performed to bond the solder material to the UBM structures respectively. After removing the photoresist layer, a second reflow process is performed to shape the solder material into spheres to form metallic bumps on the wafer, such that the metallic bumps can provide the electrical connection between the semiconductor chips and the circuit board.

For the flip-chip semiconductor device, it is necessary to form corresponding electrical connection elements (such as metallic bumps and pre-solder bumps) on the semiconductor chip and the corresponding circuit board respectively, and then perform packing and underfilling processes to accomplish the flip-chip package. Such method not only increases the fabrication processes and cost, but also raises the risk of degrading the reliability during fabrication. Moreover, according to the requirement of IC integration, the circuit size or the size and pitch of electrode pads and contact pads become gradually smaller, such that when electrical connection is to be subsequently formed for such fine circuits and such fine-pitch electrode pads and contact pads, precise positional alignment and fabrication are required but are actually very difficult to achieve.

Besides, when either the flip-chip packaging technique or the wire-bonding packaging technique is used, fabrication of the circuit board and packaging of the semiconductor chip must adopt different fabrication machines and processes, thereby making the fabrication processes complicated and the fabrication cost increased. In addition, during a molding process, the circuit board mounted with the semiconductor chip is placed in an encapsulation mold, and an epoxy resin material is injected into the mold to form an encapsulant for encapsulating the semiconductor chip. However, in practice, the mold may be limited by the design of the semiconductor package, thereby causing undesirable inaccuracy of size of a mold cavity and clamping positions, and a problem such as infirm clamping and so on. Moreover, when the resin material is injected into the mold, the encapsulant may easily flash to the surface of the circuit board. Such flashes not only impair the surface smoothness and the appearance of the semiconductor package, but also may contaminate bond pads on the circuit board for subsequently forming solder balls thereon, thereby degrading the electrical connection quality of the semiconductor package, and severely deteriorating the fabrication quality and product reliability of the semiconductor package.

Moreover, in general fabrication processes of semiconductor devices, firstly, suitable chip carriers for the semiconductor devices are made by a semiconductor chip carrier manufacturer (such as a circuit board manufacturer). Then, these semiconductor chip carriers are transferred to a semiconductor package manufacturer where chip-mounting, molding and ball-implanting processes are performed to form semiconductor packages having electronic functions required by clients. The fabrication processes involve different manufacturers (including the semiconductor chip carrier manufacture and the semiconductor package manufacturer), and thus are relatively complicated and cause difficulty in interface integration. If the clients wish to alter the function design, the associated changes and interface integration are even more complicated, thereby not providing sufficient flexibility in design alternation and economical benefits.

SUMMARY OF THE INVENTION

In light of the above prior-art drawbacks, a primary objective of the present invention is to provide a semiconductor chip electrical connection structure, wherein a circuit build-up process can be directly performed on conductive bumps formed on electrode pads of a semiconductor chip so as to accomplish electrical connection between the semiconductor chip and an external electronic element, such that fabrication processes of a semiconductor chip carrier and a semiconductor package are integrated, thereby providing better flexibility responsive to the requirements for clients and simplifying the fabrication processes and interface integration.

Another objective of the present invention is to provide a semiconductor chip electrical connection structure, which can effectively provide outward electrical extension for a semiconductor chip via simplified fabrication processes in response to the requirement of high integration of integrated circuits.

Still another objective of the present invention is to provide a semiconductor chip electrical connection structure, which can prevent problems of poor electricity and defective process reliability resulted from conventional electrical connection between a semiconductor chip and a circuit board by using a flip-chip and wire-bonding technique.

A further objective of the present invention is to provide a semiconductor chip electrical connection structure, which can simplify a connection manner between a semiconductor chip and a semiconductor chip carrier to reduce the fabrication processes and the cost, and also improve the electrical capability and reliability of an electrical connection interface of the semiconductor chip.

In accordance with the foregoing and other objectives, the present invention proposes a semiconductor chip electrical connection structure, comprising: a plurality of electrode pads formed on a surface of a semiconductor chip, wherein the semiconductor chip is attached via another surface thereof to a carrier; a plurality of conductive bumps respectively formed on the electrode pads, and exposed from a dielectric layer applied on the semiconductor chip and the carrier; and a plurality of electrical connection pads formed on the dielectric layer and electrically connected to the conductive bumps exposed from the dielectric layer, so as to provide outward electrical extension for the semiconductor chip via the electrical connection pads. Accordingly, for the semiconductor chip electrical connection structure in the present invention, conductive bumps are firstly formed on electrode pads of a semiconductor chip, and then a dielectric layer is applied on the semiconductor chip and partly removed to expose the conductive bumps. Subsequently, electrical connection pads (comprising at least electrical connection pads sized slightly larger than the conductive bumps) are formed on the dielectric layer by a circuit patterning process, such that the electrical connection pads are electrically connected to the conductive bumps exposed from the dielectric layer. This allows the highly integrated chip to be electrically extended outwardly via the conductive bumps formed on the electrode pads and via the electrical connection pads electrically connected to the conductive bumps under a condition of fine circuits and a fine pitch between the adjacent electrode pads. As a result, a circuit build-up process can be subsequently performed on the electrical connection pads to form a circuit build-up structure electrically connected to the semiconductor chip, so as to effectively provide outward electrical extension for the semiconductor chip.

Compared with the conventional wire-bonding or flip-chip semiconductor packaging technique, the semiconductor chip electrical connection structure in the present invention can advantageously provide direct outward electrical connection for the semiconductor chip via the semiconductor chip electrical connection structure formed thereon (such as electrode pads, conductive bumps and electrical connection pads) and via a circuit build-up structure formed by a build-up process or conductive elements. Thus, the electrical capability and electrical connection reliability of a connection interface of the semiconductor chip can be assured, and fabrication processes of a semiconductor chip carrier and a semiconductor package can be integrated. This thereby provides better flexibility responsive to the requirements for clients, and simplifies the semiconductor fabrication processes and interface integration, as well as prevents the problems in the prior art resulted from electrical connection between a semiconductor chip and a semiconductor chip carrier and caused by a molding process.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor chip electrical connection structure proposed in the present invention are described in detail as follows with reference to FIGS. 2A to 2G and FIGS. 3A to 3C.

FIGS. 2A to 2G are cross-sectional schematic diagrams showing procedural steps of a method for fabricating a semiconductor chip electrical connection structure according to the present invention.

Figure 1:
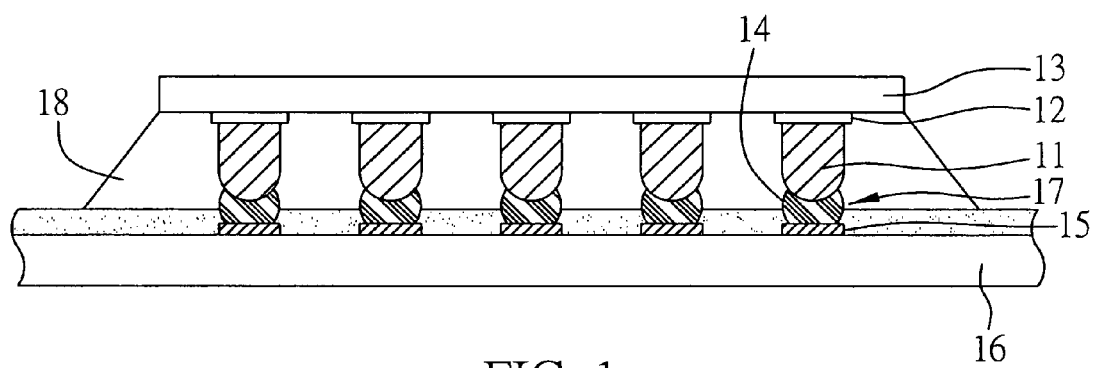
FIG. 1 (PRIOR ART) is a cross-sectional view of a conventional flip-chip ball grid array (FCBGA) package.
Figure 2A:
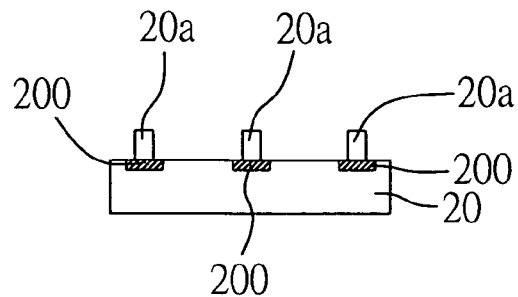
FIGS. 2A to 2G are cross-sectional schematic diagrams showing procedural steps of a method for fabricating a semiconductor chip electrical connection structure according to the present invention.

As shown in FIG. 2A, one or more chips 20 each having electrode pads 200 thereon are provided, with a plurality of conductive bumps 20a being formed on the electrode pads 200 respectively. The conductive bump 20a can be made of a conductive metal selected from the group consisting of copper (Cu), gold (Au), silver (Ag), tin (Sn), nickel (Ni) and palladium (Pd), or comprises a plurality of layers made of the foregoing metals. In practice, the conductive bump 20a is preferably made of, but not limited to, copper (Cu). Further, the conductive bumps 20a can be formed by a technique such as electroplating, physical deposition, or chemical deposition, etc. Since the fabrication method of the conductive bumps is not a technical feature of the present invention and thus not to be further described herein.

Figure 2B:
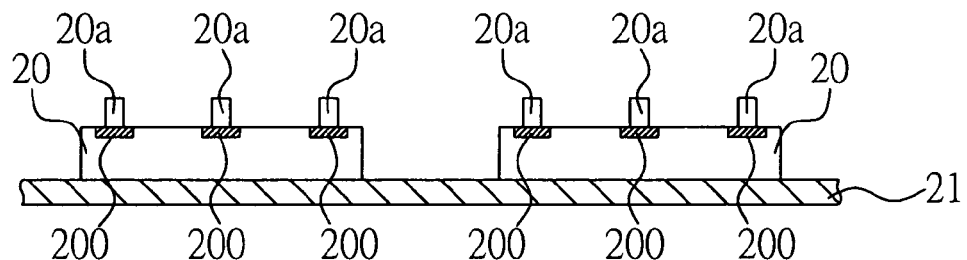

As shown in FIG. 2B, the one or more chips 20 are mounted on a carrier 21 by for example an adhesive (not shown). The carrier 21 can be an insulation board, ceramic board or metal board, and serves as a heat dissipating path for effectively transmitting heat produced during operation of the chips 20 to an external environment. Alternatively, the carrier 21 may be a circuit board formed with circuit layers, and allows the chips 20 to be directly mounted on a surface thereof, or the carrier 21 is preformed with openings (not shown) for receiving the chips. There are two chips illustrated in the drawing, however such arrangement does not set a limitation in the present invention. In fabrication, at least one chip or any number of the chips can be mounted on the carrier depending on practical requirements.

Figure 2C:
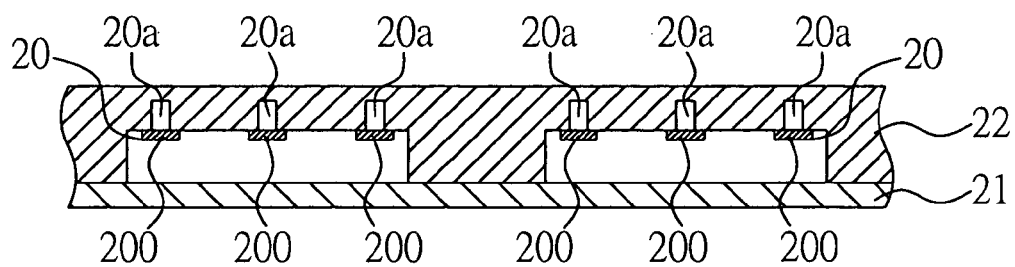

As shown in FIG. 2C, a dielectric layer 22 is formed on the carrier 21 and the chips 20. The dielectric layer 22 can be made of a photosensitive or non-photosensitive material, such as epoxy resin, polyimide, cyanate ester, aramid, polytetrafluoroethylene, benzocyclobuthene (BCB), polyphenyl ether (PPE), liquid crystal polymer (LCP), bismaleimide triazine (BT), or a mixture of epoxy resin and glass fiber, etc.

Figure 2D:
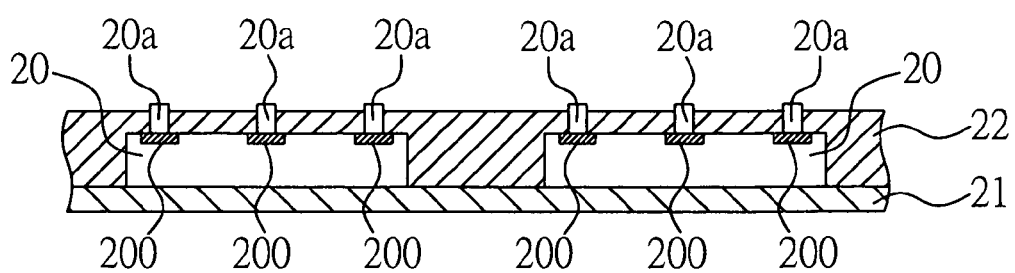

As shown in FIG. 2D, the dielectric layer 22 is partly removed to reduce its thickness by a technique such as laser, plasma etching, reactive ion etching (RIE), or photoetching, etc. so as to expose the conductive bumps 20a from the dielectric layer 22.

Figure 2E:
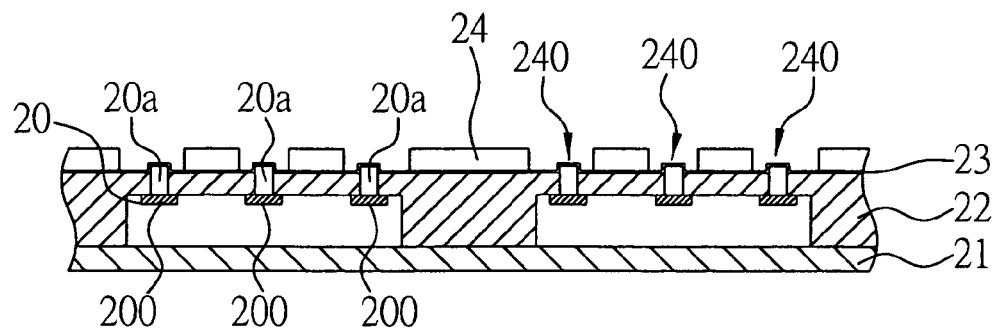

As shown in FIG. 2E, a conductive layer 23 is formed on the dielectric layer 22 and the exposed surfaces of the conductive bumps 20a. Then, a resist layer 24 is applied on the conductive layer 23, and is patterned to form a plurality of openings 240 at positions corresponding to the conductive bumps 20a.

The conductive layer 23 primarily serves as a current conductive path for subsequently electroplating metal layers. The conductive layer 23 can be made of a metal, an alloy, stacked multiple metal layers, or a conductive polymer material.

The resist layer 24 can be made of a photoresist layer such as a dry film or liquid photoresist. The resist layer 24 is formed on a surface of the conductive layer 23 by a technique such as printing, roller coating, or attaching, etc., and then is patterned by exposing and developing processes. Alternatively, the resist layer 24 may be made of a non-photosensitive resist layer and is patterned by laser ablation. As a result, the patterned resist layer 24 merely covers a portion of the surface of the conductive layer 23 and is provided with a plurality of openings 240 where conductive elements are to be formed by electroplating, wherein the openings 240 comprise at least openings located at positions corresponding to the conductive bumps 20a.

Figure 2F:
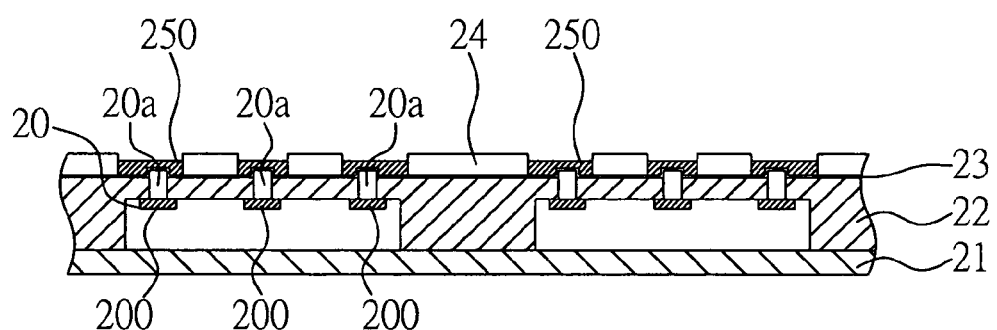

As shown in FIG. 2F, then an electroplating process is implemented to form a circuit structure on the conductive layer 23 exposed via the openings 240 of the resist layer 24, wherein the circuit structure is electrically connected to the conductive bumps 20a. The circuit structure comprises at least a plurality of electrical connection pads 250. The circuit structure may also comprises conductive circuits (not shown) electrically connected to a portion of the electrical connection pads 250. The electrical connection pads 250 can be sized slightly larger than the conductive bumps 20a. The electrical connection pads 250 cover the exposed surfaces of the conductive bumps 20a respectively.

Figure 2G:
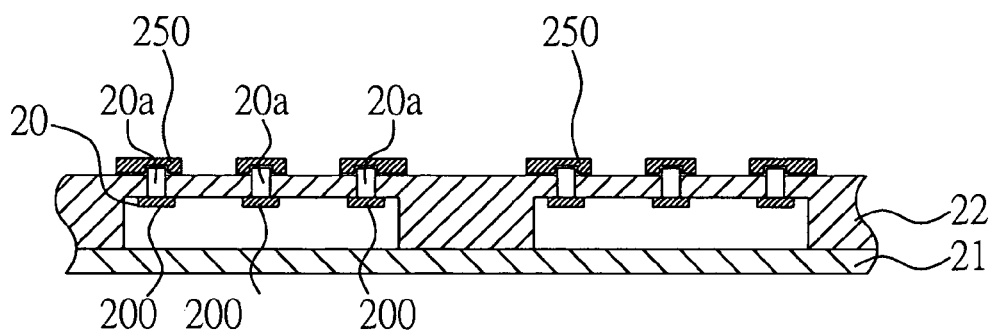

As shown in FIG. 2G, the resist layer 24 and the portion of the conductive layer 23 covered by the resist layer 24 are removed, such that outward electrical extension can be subsequently achieved for the chips 20 through the conductive bumps 20a and the electrical connection pads 250 formed on the chips 20.

In the aforementioned embodiment, the circuit structure on the dielectric layer 22 is formed by the electroplating process; however, it may also be formed by other physic deposition or chemical deposition processes in practice.

By the above fabrication method, a chip electrical connection structure in the present invention is formed, comprising: a plurality of electrode pads 200 formed on a surface of a chip 20, wherein the chip 20 is mounted via another surface thereof on a carrier 21; a plurality of conductive bumps 20a formed on the electrode pads 200 respectively, and exposed from a dielectric layer 22 applied on the chip 20 and the carrier 21; and a plurality of electrical connection pads 250 formed on the dielectric layer 22, and covering the conductive bumps 20a exposed from the dielectric layer 22, so as to provide outward electrical extension for the chip 20 via the electrical connection pads 250.

Figure 3A:
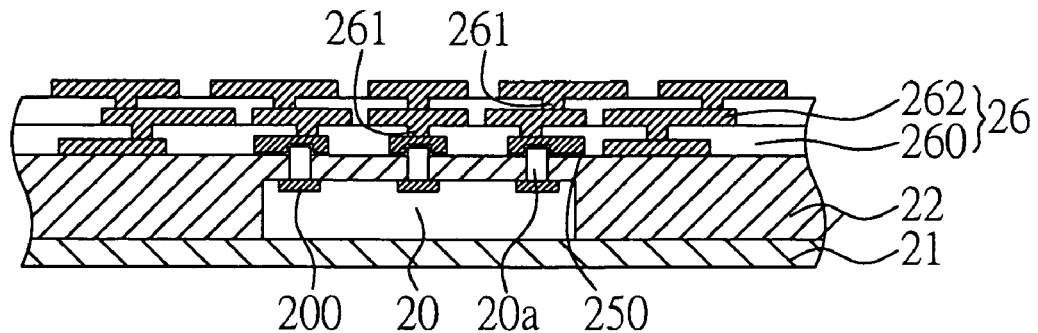
FIGS. 3A to 3C are cross-sectional views of a semiconductor device with the semiconductor chip electrical connection structure according to the present invention.
Figure 3B:
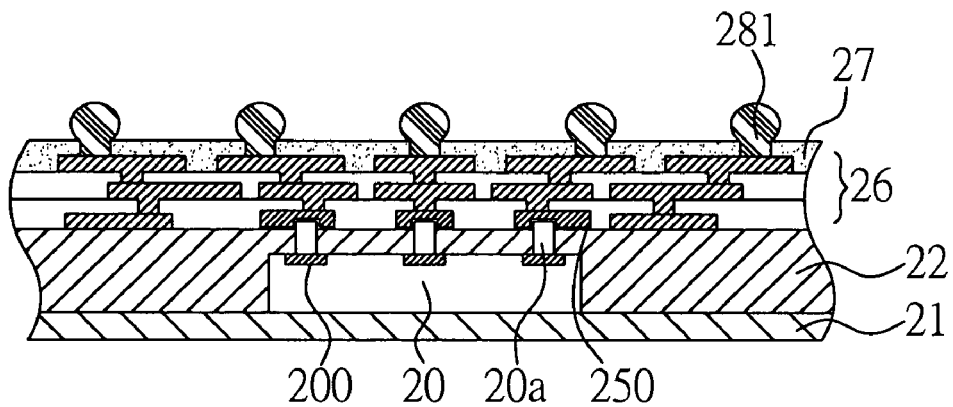
Figure 3C:
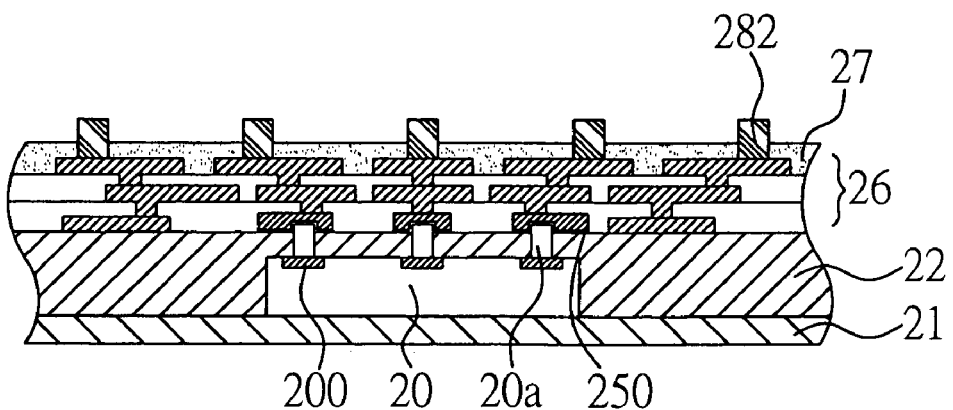

FIGS. 3A to 3C are cross-sectional views of a semiconductor device in which a carrier is integrated with a chip by the aforementioned fabrication method and a circuit build-up process is subsequently performed to fabricate the semiconductor device. It should be noted that a plurality of chips or a single chip can be incorporated in the carrier and subjected to the circuit build-up process.

As shown in FIG. 3A, the circuit build-up process can be performed on a surface of the carrier 21 integrated with the chip 20 to form a circuit build-up structure 26, wherein the circuit build-up structure 26 is electrically connected to the electrical connection pads 25 on the conductive bumps 20a of the chip 20 by a plurality of conductive structures (such as conductive blind vias). Since the circuit build-up technique is well known in the art and not a technical feature of the present invention, therefore it is not to be further described herein.

The circuit build-up structure 26 comprises at least one insulating layer 260 and a patterned circuit layer 262 stacked on the insulating layer 260. The patterned circuit layer 262 is electrically connected to the electrical connection pads 250 on the conductive bumps 20a of the chip 20 by conductive blind vias 261 formed in the insulating layer 260, wherein the electrical connection pads 250 are sized slightly larger than the underlying conductive bumps 20a. This arrangement can effectively improve alignment accuracy of circuit connection and favor subsequent build-up processes.

As shown in FIG. 3B, a patterned solder mask layer 27 can be formed on an exterior surface of the circuit build-up structure 26. The solder mask layer 27 is provided with a plurality of openings for exposing electrical connection portions on the exterior surface of the circuit build-up structure 26, such that conductive elements such as solder balls 281, conductive pillars 282 (as shown in FIG. 3C) or other conductive element can be formed on the exposed electrical connection portions so as to allow the chip 20 to be electrically connected to an external electronic device.

For the chip electrical connection structure in the present invention, conductive bumps are firstly formed on electrode pads of the chip, and then a dielectric layer is applied on the chip and is partly removed to expose the conductive bumps. Subsequently, electrical connection pads comprising at least electrical connection pads sized slightly larger than the conductive bumps are formed on the dielectric layer by a circuit patterning process, such that the electrical connection pads are electrically connected to the conductive bumps exposed from the dielectric layer. This allows the highly integrated chip to be electrically extended outwardly via the conductive bumps formed on the electrode pads and via the electrical connection pads electrically connected to the conductive bumps under a condition of fine circuits and a fine pitch between the adjacent electrode pads. As a result, a circuit build-up process can be subsequently performed on the electrical connection pads to form a circuit build-up structure electrically connected to the chip, or conductive elements (such as solder balls, metallic bumps and so on) can be directly formed on the electrical connection pads, so as to effectively provide outward electrical extension for the chip.

Compared with the conventional wire-bonding or flip-chip semiconductor packaging technique, the chip electrical connection structure in the present invention can advantageously provide direct outward electrical connection for the chip via the chip electrical connection structure formed thereon (such as electrode pads, conductive bumps and electrical connection pads) and via a circuit build-up structure formed by a build-up process or conductive elements. Thus, the electrical capability and electrical connection reliability of a connection interface of the chip can be assured, and fabrication processes of a chip carrier and a semiconductor package can be integrated. This thereby provides better flexibility responsive to the requirements for clients, and simplifies the semiconductor fabrication processes and interface integration, as well as prevents the problems in the prior art resulted from electrical connection between a chip and a chip carrier and caused by a molding process, such that quality and reliability of a fabricated semiconductor device in the present invention can be effectively improved.

The invention has been described using exemplary preferred embodiments. However, it is to be understood that the scope of the invention is not limited to the disclosed embodiments. On the contrary, it is intended to cover various modifications and similar arrangement. The scope of the claims therefore should be accorded the broadest interpretation so as to encompass all such modifications and similar arrangements.

What is claimed is:

1. A semiconductor chip electrical connection structure, comprising:
   a plurality of electrode pads formed on a surface of a chip, wherein the chip is mounted via another surface thereof on a carrier;
   a plurality of conductive bumps formed on the electrode pads, and protruding from a dielectric layer applied on the chip and the carrier, wherein a top surface and a side surface of the chip are completely covered by the dielectric layer; and
   a plurality of electrical connection pads formed on the dielectric layer and electrically connected to the conductive bumps protruding from the dielectric layer, wherein the electrical connection pads are sized larger than the conductive bumps and completely cover the protruding conductive bumps, so as to provide outward electrical extension for the chip via the electrical connection pads.

2. The semiconductor chip electrical connection structure of claim 1, wherein a plurality of conductive elements are formed on the electrical connection pads to provide external electrical connection for the chip.

3. The semiconductor chip electrical connection structure of claim 1, wherein a circuit build-up structure is formed on the electrical connection pads and electrically connected to the chip.

4. The semiconductor chip electrical connection structure of claim 3, wherein the circuit build-up structure comprises an insulating layer, a circuit layer stacked on the insulating layer, and conductive blind vias formed through the insulating layer.

5. The semiconductor chip electrical connection structure of claim 4, wherein the circuit layer is electrically connected to the electrical connection pads on the conductive bumps of the chip by the conductive blind vias.

6. The semiconductor chip electrical connection structure of claim 4, wherein a plurality of conductive elements are formed on an exterior surface of the circuit build-up structure to provide external electrical connection for the chip.

7. The semiconductor chip electrical connection structure of claim 1, wherein the conductive bumps are formed on the electrode pads of the chip by electroplating, physical deposition or chemical deposition.

* * * * *